United States Patent
Sugisawa

(10) Patent No.: US 7,262,718 B2
(45) Date of Patent: Aug. 28, 2007

(54) VARIABLE LENGTH DECODER AND VARIABLE LENGTH DECODING METHOD

(75) Inventor: Yuji Sugisawa, Kasuya-Gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 133 days.

(21) Appl. No.: 11/085,064

(22) Filed: Mar. 22, 2005

(65) Prior Publication Data

US 2005/0219082 A1 Oct. 6, 2005

(30) Foreign Application Priority Data

Mar. 30, 2004 (JP) ............................. 2004-098929

(51) Int. Cl.
*H03M 7/40* (2006.01)
(52) U.S. Cl. ..................... 341/64; 341/63; 348/426.06
(58) Field of Classification Search ................ 341/63, 341/67; 348/400.1; 375/240.26; 382/246, 382/239, 245

See application file for complete search history.

(56) References Cited

U.S. PATENT DOCUMENTS

| | | | | |
|---|---|---|---|---|
| 5,369,405 A | * | 11/1994 | Choi et al. | 341/63 |
| 5,706,001 A | * | 1/1998 | Sohn | 341/63 |
| 5,751,357 A | * | 5/1998 | Geib | 348/400.1 |
| 5,828,425 A | * | 10/1998 | Kim | 375/240.26 |
| 5,933,536 A | * | 8/1999 | Fukuzawa | 382/246 |
| 6,144,322 A | * | 11/2000 | Sato | 341/67 |
| 6,292,589 B1 | * | 9/2001 | Chow et al. | 382/239 |
| 6,414,608 B1 | * | 7/2002 | Nishida et al. | 341/67 |
| 2002/0114528 A1 | * | 8/2002 | Tanaka et al. | 382/245 |
| 2003/0020965 A1 | * | 1/2003 | LaRocca et al. | 358/426.06 |

FOREIGN PATENT DOCUMENTS

JP 8-167856 6/1996

* cited by examiner

*Primary Examiner*—Jean Bruner Jeanglaude
(74) *Attorney, Agent, or Firm*—Wenderoth, Lind & Ponack, L.L.P.

(57) ABSTRACT

A variable length decoder comprises: a first storage unit that stores encoded data; a variable length decoding unit; a second storage unit that stores coefficient data; a reverse quantizing unit; and a reverse DCT unit. The variable length decoding unit includes a control unit, a decoding unit, and an address generating unit. The second storage unit includes an initializing mechanism and is initialized all at once by the control unit in advance of decoding in a macro block unit. Only non-zero quantized data decoded by the decoding unit is stored in an address of the second storage unit generated by the address generating unit. The reverse quantizing unit reads and performs reverse quantization of the quantized data from the second storage unit, the reverse DCT unit performs reverse DCT, and then decoded data is acquired.

12 Claims, 10 Drawing Sheets

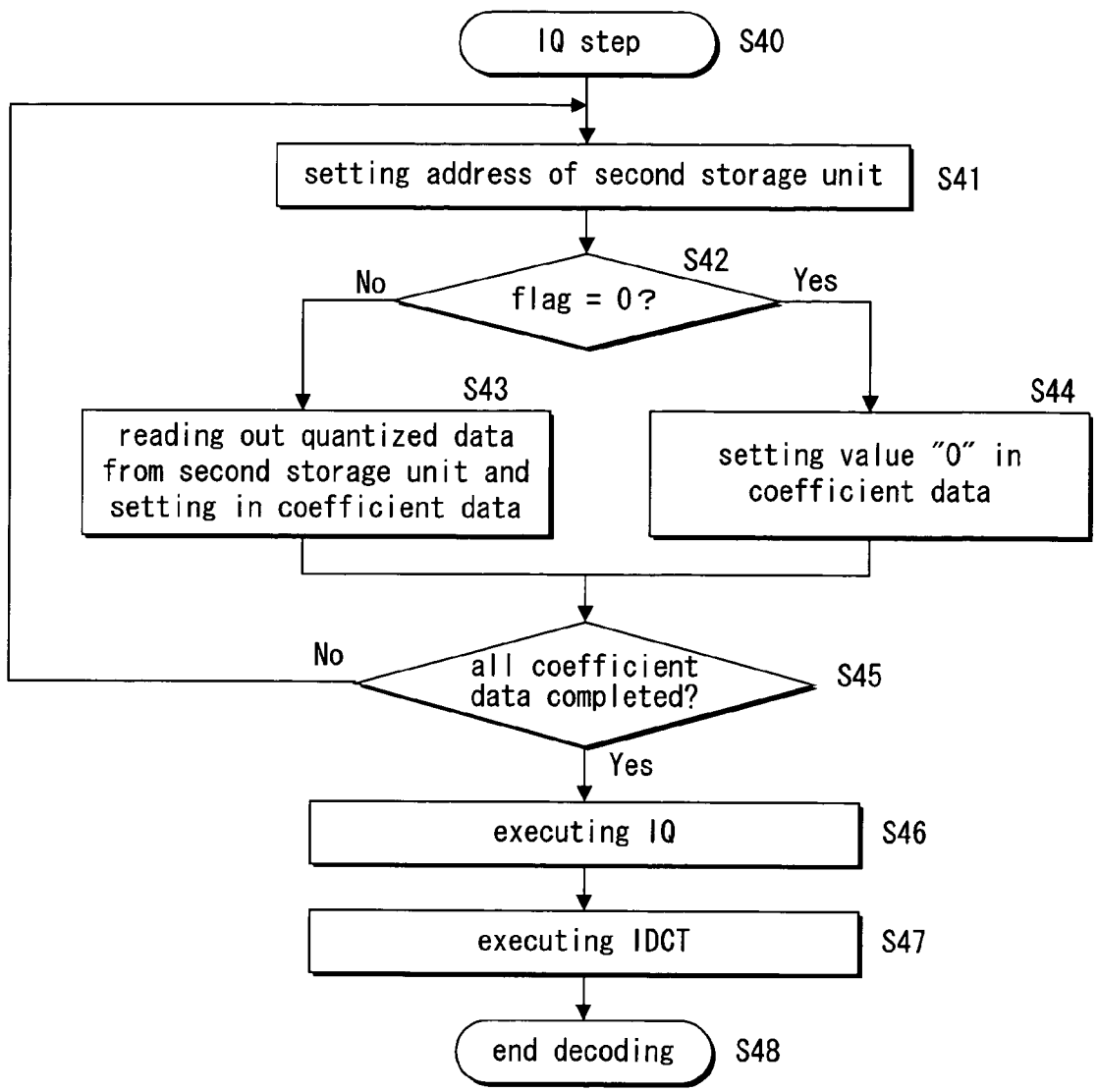

Fig. 7

| 0 | 0 | 0 | 0 |
|---|---|---|---|
| 0 | 0 | 0 | 0 |
| 0 | 0 | 0 | 0 |
| 0 | 0 | 0 | 0 |

Fig. 8

| header | 101 | 1110 | 0101001 | 01110 |
|---|---|---|---|---|

Fig. 9

| example of encoding data | (LAST, RUN, LEVEL) |
|---|---|
| 10s | (0, 0, 1) |
| 111s | (0, 0, 3) |
| 010100s | (0, 1, 2) |
| 0111s | (1, 0, 1) |
| . . . . | . . . . |
| 0000001011s | (0, 3, 4) | s = 0 → sign = plus s = 1 → sign = minus

Fig. 10
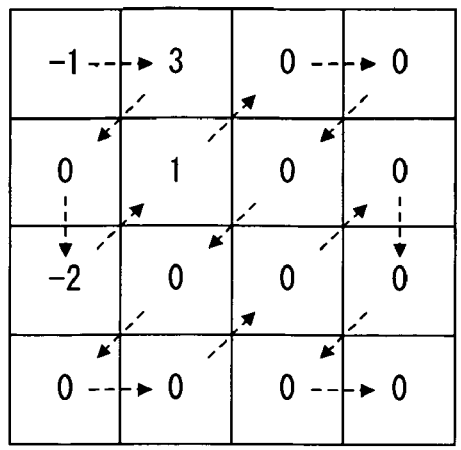
Fig. 11
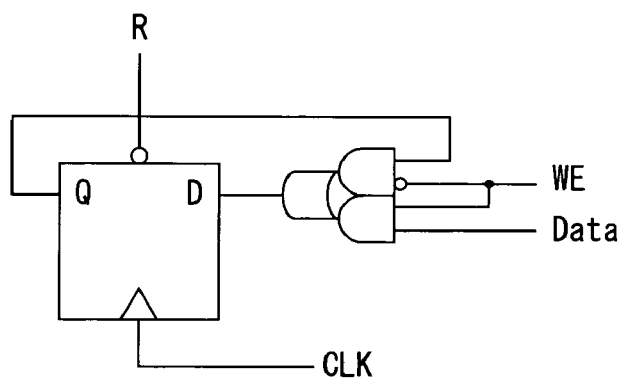
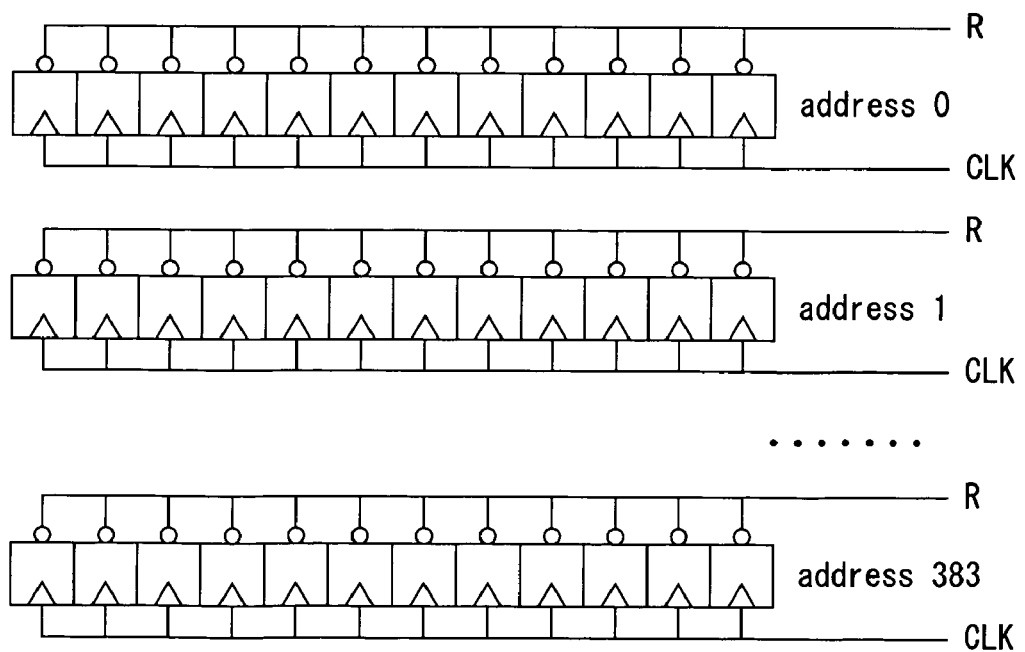

Fig. 12
| (data) | (address) |
|---|---|
| 0xFFF | 0x0000 |
| 0x003 | 0x0001 |
| 0x000 | 0x0002 |
| 0xFFE | 0x0003 |
| 0x001 | 0x0004 |
| 0x000 | 0x0005 |
| 0x000 | 0x0006 |
| ⋮ | |
| 0x000 | 0x017F |
Fig. 13
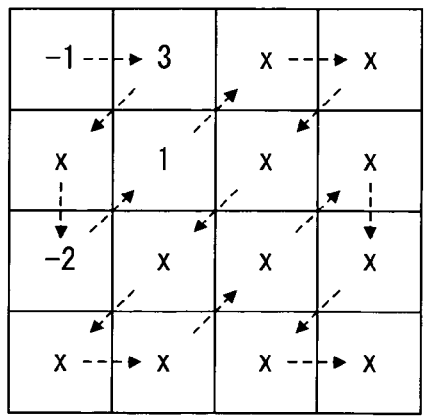
Fig. 14
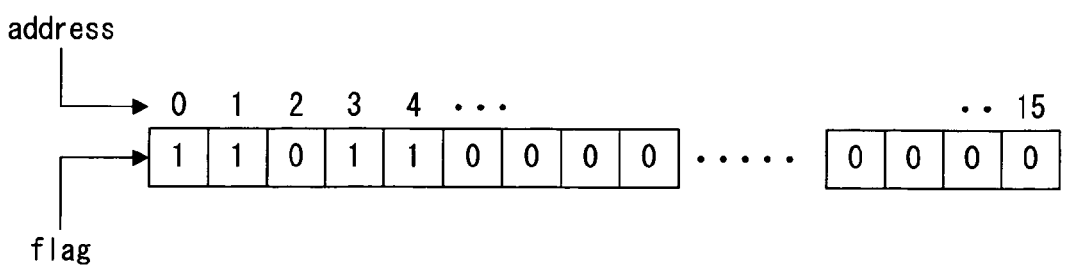

VARIABLE LENGTH DECODER AND VARIABLE LENGTH DECODING METHOD

BACKGROUND OF THE INVENTION

1. Field of the Invention

The present invention relates to a variable length decoder decoding code data that is encoded into variable length codes.

2. Description of the Related Art

As a method for compressing and expanding moving picture data, international standards such as MPEG-2 and MPEG-4 are known (See ISO/IEC 14496-10:2003, "Information technology, Coding of audio-visual objects-Parts 10:Advanced video coding"). In recent years, an LSI and a software core based on these international standards are surely installed in the digital consumer electrical appliance dealing with a moving picture.

According to these international standards, moving picture data is divided into a block of 8×8 pixels or into a macro block of 16×16 pixels, and data processing is performed in a block unit or a macro block unit.

Encoders for compressing moving picture data such as MPEG2 and MPEG4 comprise mainly a discrete cosine transformer (DCT), a quantizer (Q), and a variable length encoder (VLC). Inputted pixel data is first transformed into frequency domain data from space domain data by the discrete cosine transformer. When the pixel data consists of a natural scene image and is transformed into the frequency domain data, the data concentrates in a low frequency domain.

Next, among the frequency domain data obtained by the discrete cosine transformer, quantizing is roughly performed in a quantizer in order to make a coefficient of a high frequency component take the value "0". Then, among the frequency data, non-zero coefficients are concentrated in low frequency components and all the data in high frequency component is transformed into the value "0". In the variable length encoder, a data set of non-zero and zero is generated performing a zigzag scan so that the data is composed in an order from the low frequency components to the high frequency components, that is, the value "0" may be easily gathered. This data set is encoded into variable length codes using a table of the Huffman code to obtain variable length encoded data.

The above-mentioned variable length encoded data is provided through a recording medium or a network. A decoder for decoding moving picture data by decoding the variable length encoded data generally comprises a variable length decoder (VLD), an inverse quantizer (IQ), and an inverse discrete cosine transformer (IDCT).

FIG. 15 is a block diagram illustrating the conventional image decoding device. The conventional image decoding device illustrated in FIG. 15 comprises an encoded data memory 1, and a variable length decoder (VLD) 2, which includes an address generator 2a, a coefficient data memory 3, an inverse quantizer (IQ) 4, and an inverse DCT 5. The encoded data memory 1 stores variable length encoded data in which moving picture data is encoded into variable length codes. The coefficient data memory 3 stores a run-length value that is coefficient data (that is, quantized data) transformed by the variable length decoder 2.

An outline of operation of the conventional image decoding device illustrated in FIG. 15 is explained in the following.

When variable length encoded data is provided to the variable length decoder 2 from the encoded data memory 1, the variable length decoder 2 initializes the coefficient data memory 3. That is, the variable length decoder 2 performs a clear processing as this initialization processing by writing in a value "0" to all the addresses of the coefficient data memory 3.

A processing of image data in an image decoding device is generally performed in a macro block unit. For example, when the structure ratio of pixel data is Y: Cb: Cr=4:2:0, one macro block comprises Y: 16×16 pixels, Cb: 8×8 pixel, and Cr: 8×8 pixels which is a total of 384 pixels. Therefore, initialization for 384 symbols is required for initialization of one macro block. (One pixel usually has a pixel value of one symbol consisting of 8 bits.) When an initialization processing of one cycle per pixel is required, 384 cycles are required for the initialization processing of one macro block.

After the initialization processing is completed, the variable length decoder 2 checks variable length encoded data (bit string) from the encoded data memory 1 with the variable length decoding table which is prepared independently, and decodes the variable length encoded data to quantized data. Among the quantized data, only thenon-zero quantized data is written in the coefficient data memory 3. An address generator 2a generates an address where the non-zero quantized data should be written in the coefficient data memory 3.

Thereby, when decoding processing for one macro block is completed, decoding processing for the next macro block is performed. Here, in order to perform decoding processing for a new macro block in the conventional image decoding device illustrated in FIG. 15, the coefficient data memory 3 needs to be initialized. Since every decoding processing for macro blocks needs this initialization, the ratio of time required for initialization processing results in a lot of time being wasted in the decoding.

In the conventional image decoding device illustrated in FIG. 15, the number of decoding cycles which is required until the last coefficient data (quantized data) is stored is as follows.

(decoding cycles)=(at least 384 cycles of initialization processing)+(the number of symbols of non-zero)*(the number of decoding cycles per symbol in VLD)

The number of one symbol is equivalent to one quantized data.

Since a low operation frequency is desirable in the image decoding device installed in a portable device powered by a battery, it is also desirable for the above-mentioned decoding cycle to be low in operation frequency cycle. However, in recent years, the number of decoding cycles is increasing because of an increase in screen size and in the number of moving picture processing frames in a unit time, therefore the cycle numbers required for initialization processing need to be small. Furthermore, every decoding processing of a macro block requires 384 cycles of access for the initialization processing of the coefficient data memory 3, so power consumption tends to increase. The number of access times to the coefficient data memory 3 needs to be reduced.

FIG. 16 is a block diagram that is improved so that the time required for an initialization processing is reduced compared to the conventional image decoding device as in FIG. 15. That is, FIG. 16 is the block diagram of the improved conventional image decoding device. In FIG. 16, explanation is omitted by giving the same symbols regarding the same components as in FIG. 15.

As illustrated in FIG. 16, the improved conventional image decoding device comprises a coefficient data memory 3a and a coefficient data memory 3b that are installed in parallel, and a converter 6 which converts the coefficient data memory 3a and the coefficient data memory 3b one after the other.

In the improved conventional image decoding device illustrated in FIG. 16, when variable length encoded data is provided from the encoded data memory 1 to the variable length decoder 2, the variable length decoder 2 first initializes the coefficient data memory 3a. After initialization is completed, the variable length decoder 2 converts selection of the converter 6, and initializes the coefficient data memory 3b. Simultaneously, the variable length decoder 2 checks the variable length encoded data (bit stream) from the coded data memory 1 with the variable length decoding table which is prepared independently, decodes quantized data, and writes only the non-zero quantized data among the quantized data in the coefficient data memory 3a.

Thus, the effect of the time required in initialization processing is reduced by converting the two coefficient data memory 3a and 3b that are installed in parallel, and by performing the initialization processing and decoding processing and data writing processing in parallel.

In the improved conventional image decoding device illustrated in FIG. 16, the number of decoding cycles which is required until the last coefficient data (quantized data) is stored is the greater of (at least 384 cycles of initialization processing) and (the symbol numbers of non-zero)*(the number of decoding cycles per symbol in the VLD). However, the two coefficient data memory 3a and 3b need to be installed in the improved conventional image decoding device illustrated in FIG. 16, therefore increase in a circuit area can not be avoided.

OBJECTS AND SUMMARY OF THE INVENTION

An object of the present invention is to realize decoding variable length encoded data efficiently at a high level with few hardware resources, and to provide a variable length decoder whose power consumption is low.

A first aspect of the present invention provides a variable length decoding device operable to decode variable length encoded data, the variable length decoding device comprising: a variable length decoding unit operable to transform the variable length encoded data to quantized data; and a storage unit operable to store the quantized data, wherein the variable length decoding unit stores only non-zero quantized data of the quantized data transformed by the variable length decoding unit.

According to the present structure, since it is sufficient for a variable length decoding unit to store only the non-zero quantized data among the transformed quantized data in the storage unit, the time for decoding processing can be reduced. This structure allows the variable length decoder to add a storage unit having an initializing function and/or a non-zero data flag memory, thereby expanding functions of the variable length decoder moreover.

A second aspect of the present invention provides the variable length decoding device as defined in claim 1, wherein the storage unit comprises an initializing mechanism operable to initialize all area of the storage unit, and wherein the variable length decoding unit stores only the non-zero quantized data of the quantized data after the initializing mechanism has initialized all area of the storage unit to zero.

According to the present structure, since initializing a storage unit, which is required for every decoding of a macro block, can be processed in one cycle by using an initializing mechanism, the time required for initializing the storage unit can be shortened remarkably.

A third aspect of the present invention provides the variable length decoding device as defined in the second aspect, wherein the variable length decoding unit comprises: a control unit; a decoding unit; and an address generating unit, wherein the control unit issues a control signal to the initializing mechanism, wherein the initializing mechanism, upon receipt of the control signal, initializes all areas of the storage unit to zero, wherein the decoding unit transforms the encoded data to intermediate data, and generates the quantized data based on the intermediate data, wherein the address generating unit generates, based on the intermediate data, an address of the storage unit, the address being where the non-zero quantized data should be stored, and wherein the decoding unit stores the non-zero quantized data to the address of the storage unit generated by the address generating unit after the control unit has initialized all areas of the storage unit.

According to the present structure, the storage unit is initialized by making the control signal that the control unit sends act as a trigger. After the initialization, the decoding unit stores the non-zero quantized data among the quantized data which is the transformed encoded data; therefore the decoding processing can be performed in a precise order. Furthermore, since few processing cycles are required for initializing the storage unit, the speed of decoding can be improved.

A fourth aspect of the present invention provides the variable length decoding device as defined in the second aspect, further comprising: an inverse quantizing unit; and an inverse discrete cosine transforming unit, wherein the inverse quantizing unit generates DCT data based on the quantized data read from the storage unit, and wherein the inverse discrete cosine transforming unit generates decoded data based on the DCT data.

According to the present structure, since the time required for initializing the storage unit for every decoding of a macro block is short, the variable length decoder can operate at high speed.

A fifth aspect of the present invention provides the variable length decoding device as defined in the first aspect, further comprising: a flag register operable to store, for each address of the storage unit, a flag indicating either zero quantized data or non-zero quantized data, wherein the variable length decoding unit sets a flag indicating zero to each address of the flag register, thereby initializing the flag register, wherein the variable length decoding unit stores only non-zero quantized data of the transformed quantized data to the storage unit, and wherein the variable length decoding unit sets a flag indicating non-zero to a corresponding address of the flag register.

According to the present structure, since the address of the zero quantized data on the storage unit can be known by investigating the flag of the flag register, only the non-zero quantized data among the transformed quantized data needs to be stored in the storage unit. The zero quantized data does not need to be stored in the storage unit. Since initializing the storage unit is unnecessary, there is an advantage that the storage unit does not have to be composed of a special memory or a special register.

A sixth aspect of the present invention provides the variable length decoding device as defined in the fifth aspect, wherein the variable length decoding unit comprises: a control unit; a decoding unit; and an address generating unit, wherein the control unit issues a control signal to the flag register to initialize the flag register, wherein the flag register sets, according to the control signal, a flag indicating zero to each address thereof, wherein the decoding unit transforms the encoded data to intermediate data, and generates the quantized data based on the intermediate data, wherein the address generating unit generates, based on the intermediate data, an address of the storage, the address being where the non-zero quantized data should be stored, and wherein the decoding unit stores the non-zero quantized data to the storage at the address which has been generated by the address generating unit, and sets a flag indicating non-zero to a corresponding address of the flag register.

According to the present structure, the flag register is initialized by making the control signal that the control unit sends act as a trigger. After the initialization, the decoding unit stores the non-zero quantized data among the quantized data which is the transformed encoded data and sets a flag of non-zero to the address corresponding to the flag register. Thereby, the address of the non-zero quantized data in the storage unit can be known by investigating the flag of the flag register. Furthermore, initializing the storage unit is unnecessary, and the storage unit may be composed of an ordinary memory.

A seventh aspect of the present invention provides the variable length decoding device as defined in the fifth aspect, further comprising: an inverse quantizing unit operable to read the quantized data from a corresponding address of the storage unit when the flag of the flag register indicates non-zero, wherein when the flag of the flag register indicates zero, the inverse quantizing unit acquires a value of zero, thereby generating DCT coefficients According to the present structure, since a quantizing unit does not access an address where the quantized data of zero should be stored, the storage unit does not have to be initialized. Therefore, a processing cycle required for initializing the storage unit can be saved.

An eighth aspect of the present invention provides the variable length decoding device as defined in claim 7, further comprising: an inverse discrete cosine transforming unit operable to generate decoded data based on the DCT coefficients generated by the inverse quantizing unit.

According to the present structure, a highly-efficient variable length decoder which decodes variable length encoded data can be realized by setting a flag register to the regular variable length decoder.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 5 is a flowchart showing a second half of the variable length decoder according to Embodiment 2 of the present invention;

FIG. 6 is an illustration showing a data storing state of a first storage unit according to Embodiment 1 of the present invention;

FIG. 7 is an illustration showing a state after initializing the second storage unit according to Embodiment 1 of the present invention;

FIG. 8 is an illustration showing a bit string read from the first storage unit according to Embodiment 1 of the present invention;

FIG. 9 is an illustration showing a variable length decoding table according to Embodiment 1 of the present invention;

FIG. 10 is an illustration showing a state after data storing of the second storage unit according to Embodiment 1 of the present invention;

FIG. 11 is a block diagram illustrating the second storage unit of a one-dimensional string according to Embodiment 1 of the present invention;

FIG. 12 is an illustration showing a state after data storing of the second storage unit of the one-dimensional string according to Embodiment 1 of the present invention;

FIG. 13 is an illustration showing a state after data storing of the second storage unit according to Embodiment 2 of the present invention;

FIG. 14 is an illustration showing a state after a flag setup of the flag register according to Embodiment 2 of the present invention;

EMBODIMENT 1

Figure 1:
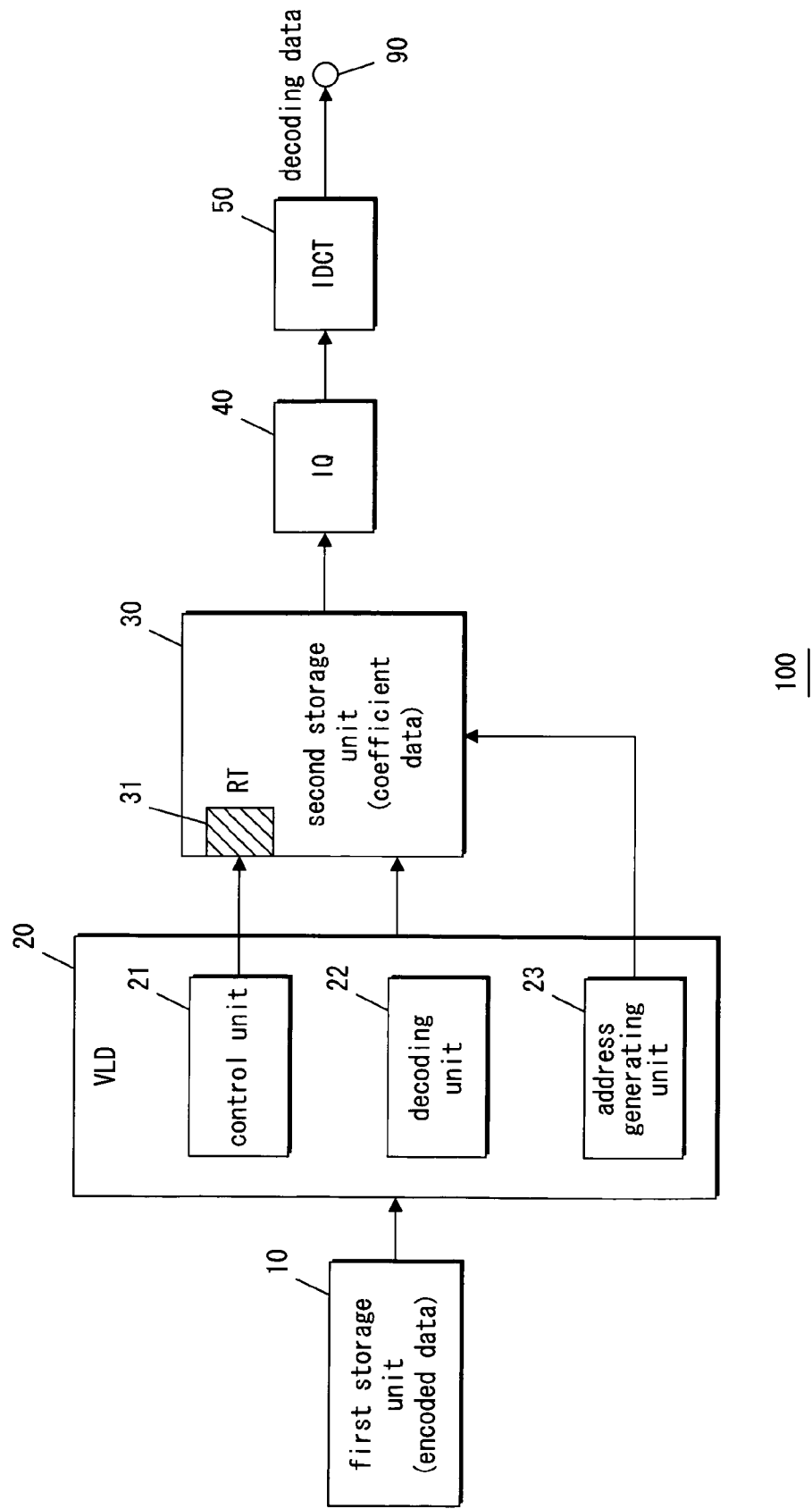
FIG. 1 is a block diagram illustrating a variable length decoder according to Embodiment 1 of the present invention.

FIG. 1 is a block diagram of a variable length decoder 100 in Embodiment 1 of the present invention. The variable length decoder 100 of the present embodiment comprises: a first storage unit 10 that stores encoded data; a variable length decoding unit (VLD) 20; a second storage unit 30 that stores coefficient data; an inverse quantizing unit (IQ) 40; and an inverse DCT unit (IDCT) 50.

The variable length decoding unit 20 comprises a control unit 21, a decoding unit 22, and an address generating unit 23.

The second storage unit 30 comprises an initializing mechanism; therefore, it can initialize all the addresses of the second storage unit 30 at once according to a control signal that is inputted in a reset terminal 31. In the following explanation, it is assumed that the second storage unit 30 is arranged in a two-dimensional array (4×4 elements) for simplification.

Figure 3:
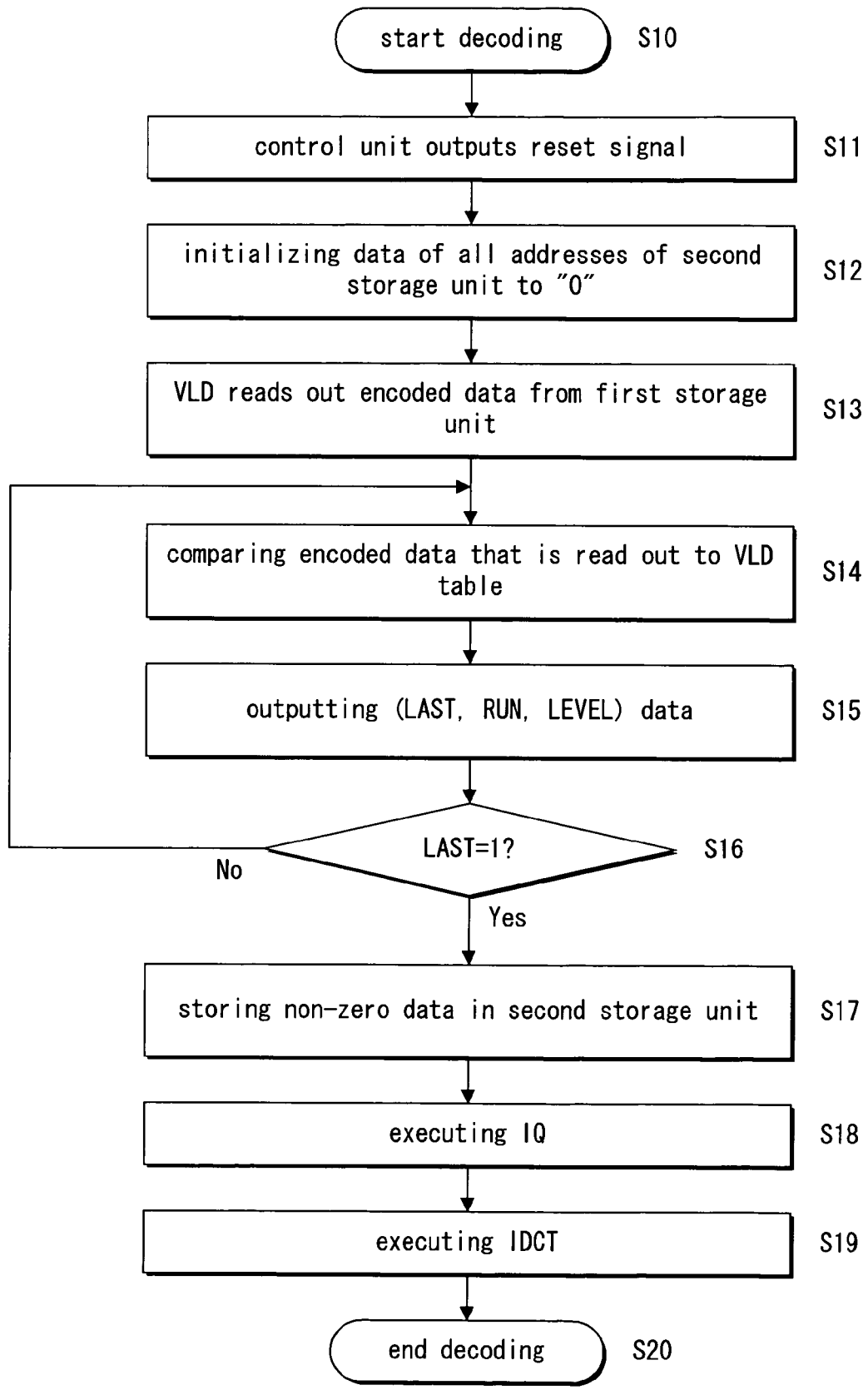
FIG. 3 is a flowchart showing the variable length decoder according to Embodiment 1 of the present invention.

FIG. 3 is a flowchart of the variable length decoder 100 in Embodiment 1 of the present invention. According to the flowchart shown in FIG. 3, operation of the variable length decoder 100 of the present embodiment is explained.

It is assumed that the first storage unit 10 stores the encoded data, which is shown in FIG. 6, along with a header relating thereto. In other words, FIG. 6 illustrates a status of data storage of the first storage unit of Embodiment 1 of the present invention. An address (0x0000) (hereinafter, the symbol of "0x" means a hexadecimal number.) and an address (0x0001) of the first storage unit 10 store a value of a header respectively, and the encoded data is stored in an address (0x0002) or thereafter.

When decoding processing starts at Step S10, the variable length decoding unit starts operation thereof.

At Step S111, the decoding unit 22 reads a value (0xC000) of a header and a value (0x01B3) from the addresses (0x0000) and (0x0001) of the first storage unit 10, and performs header processing. Then, the control unit 21 outputs a reset signal, which is the control signal for initializing the second storage unit 30, to the reset terminal 31 of the second storage unit 30.

At Step S12, when the reset terminal 31 of the second storage unit 30 receives the reset signal, the second storage unit 30 resets each data of all the addresses of the second storage unit 30 to a value "0", thereby performing initialization. When the initialization is completed, each value of all array elements (4×4) of the second storage unit 30 is replaced with the value "0" as shown in FIG. 7. In other words, FIG. 7 illustrates a state of the second storage unit 30 after the initialization in Embodiment 1 of the present invention. After the initialization is completed, the variable length decoding unit 20 moves to a state of decoding processing.

At Step S13, the decoding unit 22 reads the encoded data from the first storage unit 10. The decoding unit 22 reads data (0xBCA5) from the address (0x0002) of the first storage unit 10 and data (0xDFFF) from the address (0x0003) of the first storage unit 10. To be more specific, the data described with the hexadecimal number can be expressed in binary notation as follows:

(0xBCA5)=(1011110010100101)

(0xDFFF)=(1101111111111111)

The bit string, which is read out, is divided into a plurality of code data strings according to the information indicating division of the bit string. FIG. 8 illustrates the bit string that is read out from the first storage unit 10 in Embodiment 1 of the present invention. As shown in FIG. 8, the bit string, which is read out, is divided into a code data string (101), a code data string (1110), a code data string (0101001), and a code data string (01110). The code data string (101) follows the header.

In FIG. 3, at Step S14, the decoding unit 22 compares the read code string with a variable length decoding table (VLC table), which is prepared separately, thereby performing decoding. The variable length decoding table is implemented into an inner position of the decoding unit 22 as a logical circuit. This logical circuit operates as a look-up table.

FIG. 9 illustrates the variable length decoding table in Embodiment 1 of the present invention. As shown in FIG. 9, the variable length decoding table indicates the correspondence relation for converting a code data string into combined data (LAST, RUN, LEVEL). The combined data (LAST, RUN, LEVEL) is intermediate data.

In the combined data (LAST, RUN, LEVEL), data (LAST) expresses whether the concerned decoding data is the last data or not. When LAST=1, the concerned decoding data is the last data. When LAST=0, the concerned decoding data is not the last data.

Data (RUN) expresses how many times the value "0" is strung out in front of the concerned decoding data.

Data (LEVEL) expresses the value of the non-zero part of the concerned decoding data.

In FIG. 9, the lowest rank bit "s" of the code data string is a bit that expresses signs. When s=0, the data (LEVEL) is plus, and when s=1, the data (LEVEL) is minus.

Stated quite simply, in FIG. 9, the code data string is arranged in order of the code data string, which is inputted in FIG. 8. However, this table is for simple explanation, and is not necessarily based on the standard of MEG4.

In FIG. 3, at Step S15, the decoding unit 22 converts the code data string, which is inputted in FIG. 8, to the combined data (LAST, RUN, LEVEL) one by one according to FIG. 9. First, the code data string (101) is converted into combined data (0, 0, 1) (a sign of the data (LEVEL) is minus).

At Step S16, whether or not LAST=1 is judged. In this case, since LAST=0, the judgment result is "NO", and the processing returns to Step S14.

After the processing at Step S14 and Step S15 is performed, the decoding unit 22 converts the code data string (1110) to combined data (0, 0, 3) (a sign of the data (LEVEL) is plus).

At Step S16, since LAST=0, the judgment result is "No", and the processing returns to Step S14.

After the processing at Step S14 and Step S15 is performed, the decoding unit 22 converts the code data string (0101001) to combined data (0, 1, 2) (a sign of the data (LEVEL) is minus).

At Step S16, since LAST=0, the judgment result is "No", and the processing returns to Step S14.

After the processing at Step S14 and Step S15 is performed, the decoding unit 22 converts the code data string (01110) to combined data (1, 0, 1) (a sign of the data (LEVEL) is plus).

At Step S16, since LAST=1, the judgment result is "Yes" and the processing moves to Step S17.

Thereby, conversion processing, which compares the inputted code data string with the variable length decoding table in FIG. 9, is completed, and the combined data (0, 0, 1), (0, 0, 3), (0, 1, 2) and (1, 0, 1) is acquired.

At Step S17, the non-zero data is stored in the second storage unit 30. First, the address generating unit 23 refers to the value of data (RUN) of the acquired combined data, and determines an address of the second storage unit 30, which stores the non-zero data, one after another.

As a result, an address (0) stores LEVEL=1; an address (1) stores LEVEL=3; an address (3) stores LEVEL=2 (since RUN=1, there is one value "0" before this.); and an address (4) stores LEVEL=1.

The decoding unit 22 stores the value of each LEVEL in the address of the second storage unit 30, which the control unit 21 has determined, considering the signs thereof.

FIG. 10 illustrates a state of the second storage unit 30 after data-storing in Embodiment 1 of the present invention. In the second storage unit 30, as shown by the dotted arrow in FIG. 10, the address is set up in a zigzag manner.

Thereby, the conversion to the quantization data of encoded data is completed, and the conversion result has been stored in the second storage unit 30.

At Step S18, the inverse quantizing unit 40 reads the data of the variable length decoding unit 20, performs inverse quantization processing, and then generates DCT data.

At Step S19, the inverse DCT unit 50 performs inverse DCT processing by using the DCT data, which the inverse quantizing unit 40 has generated, and outputs the decoding data to an output terminal 90.

At Step S20, the decoding processing of one macro block is completed.

According to the variable length decoder 100, since initialization of a storage unit necessary for each decoding of a macro block can be performed in one cycle using the initializing mechanism the necessary time for initializing the storage unit can be shortened remarkably.

As clearly shown in FIG. 10, the variable length decoder 100 initializes each value of the second storage unit 30 to the value "0" at the beginning of the decoding processing of one macro block, determines an address, whose value is non-zero and should be stored, and then stores the non-zero value in the second storage unit 30. By this method, the decoding unit 22 does not need to access to addresses after the address (2) and the address (5) at all in the above-mentioned example of the encoded data. Thus, according to the variable length decoder 100 of the present embodiment, since the variable length decoding unit 20 needs to store only the non-zero quantized data within the quantized data that is converted in the storage unit, thereby shortening the decoding processing time and reducing the power necessary for accessing the storage unit.

In the explanation of Embodiment 1 of the present invention, as mentioned above, it is assumed that the second storage unit 30 comprises a two-dimensional array (4×4 elements); however the second storage unit 30 may be a one-dimensional array. In this case, what is necessary is that the address of the one-dimensional array is arranged in order of the zigzag scan of the storage unit of the two-dimensional array.

FIG. 11 is a block diagram of the second storage unit 30 of the one-dimensional array in Embodiment 1 of the present invention. The upper part of FIG. 11 expresses construction of memory cells, each of which stores 1 bit of the second storage unit 30. These memory cells comprise: a reset input portion (R); a clock input portion (CLK); a data input portion (Data); and a write enable signal input portion (WE). The lower part of FIG. 11 is a block diagram of the second storage unit 30. 12 memory cells per one address are arranged to form an element for one address-12 bits construction. Furthermore, 384 elements, each of which is an address, are combined to form a storage unit for 384 addresses*12 bits construction.

FIG. 12 illustrates a state of the second storage unit of the one-dimensional array after data-storing in Embodiment 1 of the present invention. FIG. 12 shows a state where the quantized decoded data, which is the same as in FIG. 10, is stored in the second storage unit 30 of FIG. 11. In other words, first, each value of all the addresses of FIG. 12 is initialized into data (0x000), secondly, only non-zero quantization data is overwritten.

As a result, data (0xFFF), which is the hexadecimal number of data (−1), is stored in the address (0x0000). Data (0x003), which is the hexadecimal number of data (3), is stored in the address (0x0001). Data (0xFFE), which is the hexadecimal number of data (−2), is stored in the address (0x0003). Data (0x001), which is the hexadecimal number of data (1), is stored in the address (0x0004).

Needless to say, according to the second storage unit 30 shown in FIG. 11, the second storage unit 30 can be initialized in one cycle.

EMBODIMENT 2

Figure 2:
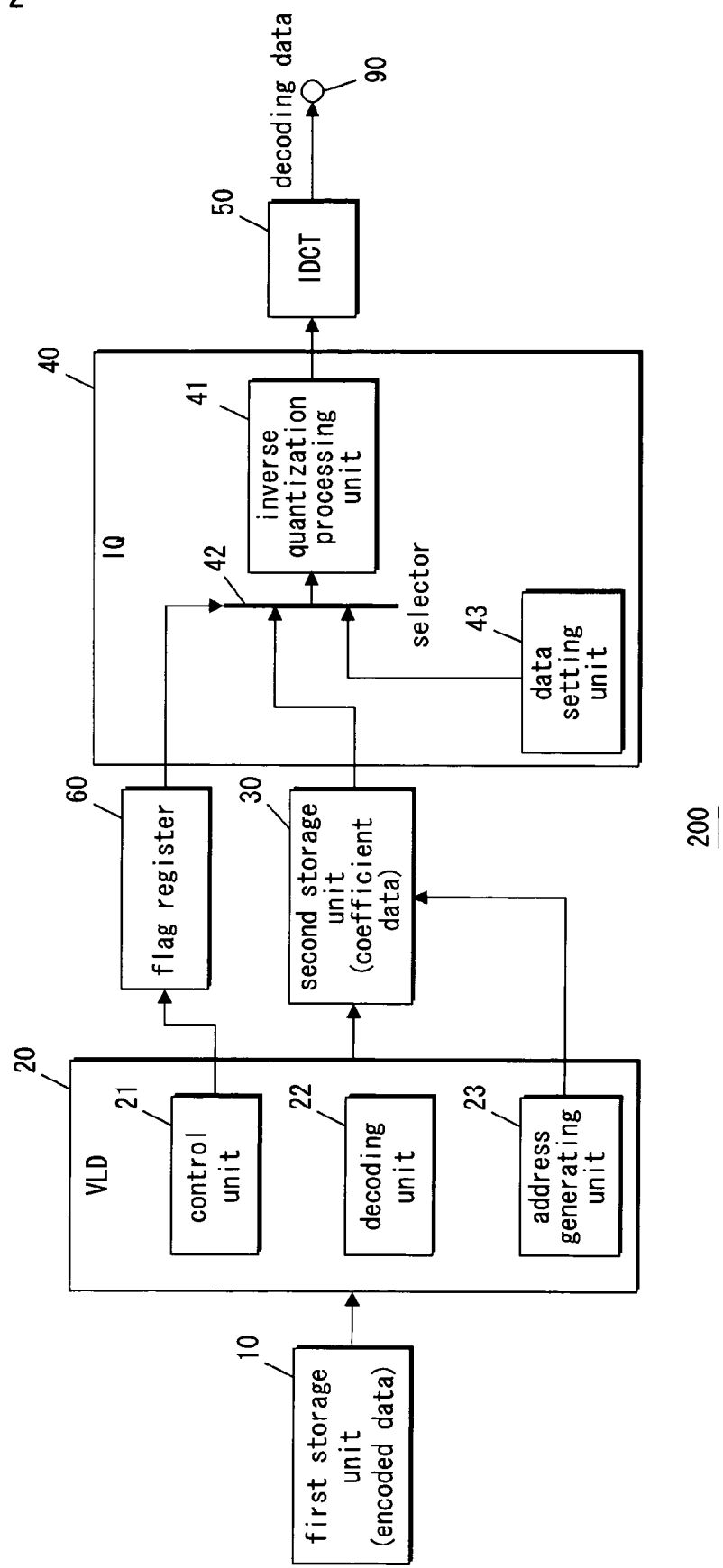
FIG. 2 is a block diagram illustrating a variable length decoder according to Embodiment 2 of the present invention.

FIG. 2 is a block diagram of a variable length decoder 200 in Embodiment 2 of the present invention. The variable length decoder 200 of the present embodiment shown in FIG. 2 comprises: the first storage unit 10 that stores encoded data; the variable length decoding (VLD) unit 20; the second storage unit 30 that stores coefficient data; a flag register 60; the inverse quantizing (IQ) unit 40; and the inverse DCT (IDCT) unit 50.

The variable length decoding unit 20 comprises: the control unit 21; the decoding unit 22; and the address generating unit 23. The control unit 21 transmits a control signal to the flag register 60.

The inverse quantizing unit 40 comprises: an inverse quantization processing unit 41; a selector 42; and a data setting unit 43. The data setting unit 43 always outputs a predetermined value "0".

The selector 42 selects the data, which the inverse quantization processing unit 41 reads, should be acquired from either the second storage unit 30 or the data setting unit 43. This selection depends upon a flag stored by the flag register 60.

According to each address of the second storage unit 30, the flag register 60 stores a flag showing that the quantization data stored in the second storage unit 30 is zero or non-zero. The flag register 60 of the present embodiment stores a flag value "0" when the quantized data is zero. When the quantized data is non-zero, the flag register 60 of the present embodiment stores a flag value "1."

Figure 4:
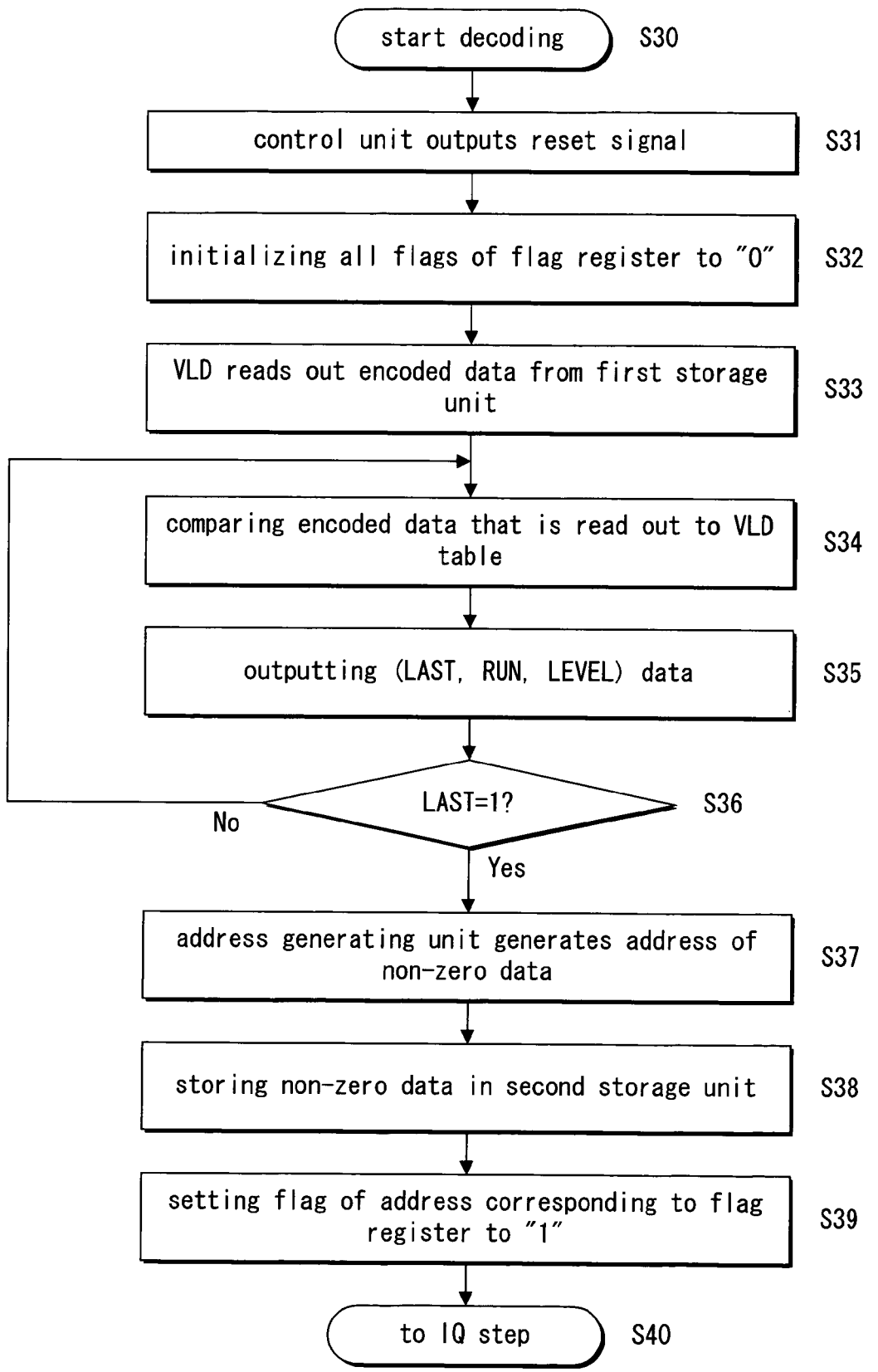
FIG. 4 is a flowchart showing a first half of the variable length decoder according to Embodiment 2 of the present invention.
Figure 15:
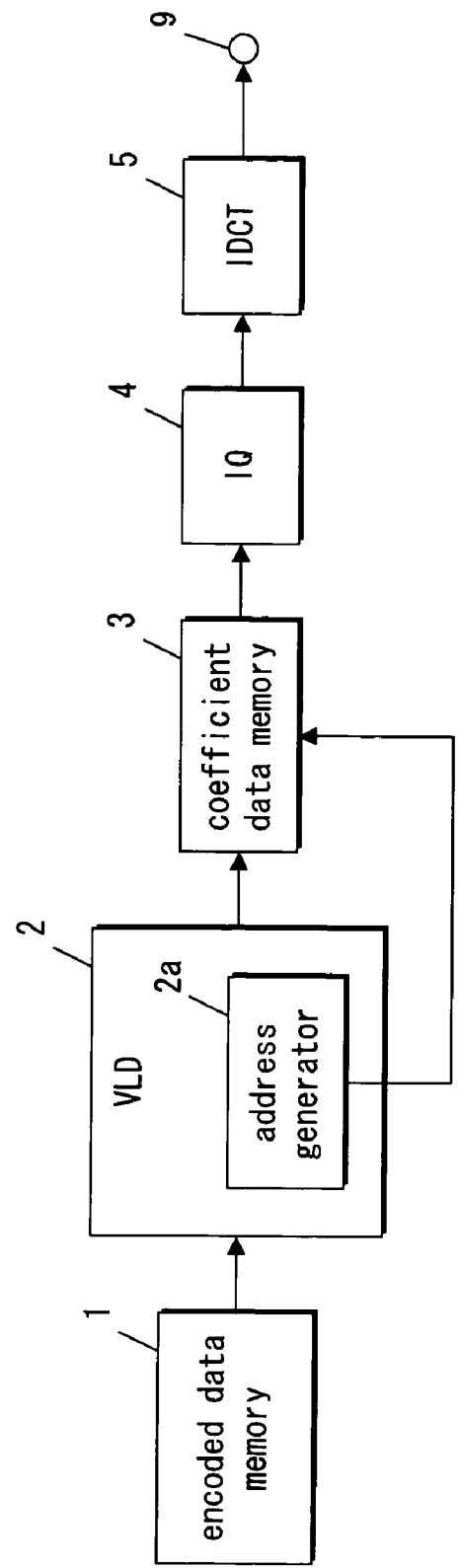
FIG. 15 is a block diagram illustrating the conventional image decoding device.
Figure 16:
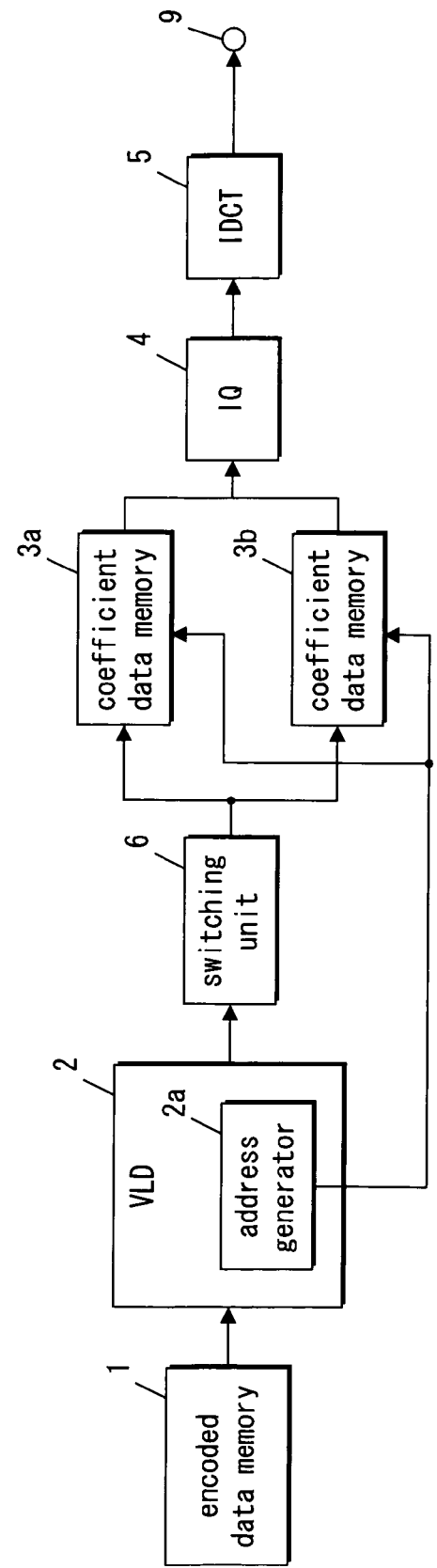
FIG. 16 is a block diagram illustrating the improved conventional image decoding device.

FIG. 4 is a flowchart in the first half of the variable length decoder 200 in Embodiment 2 of the present invention. FIG. 5 is a flowchart in the second half of the variable length decoder 200 in Embodiment 2 of the present invention. According to the flowcharts of FIG. 4 and FIG. 5, operation of the variable length decoder 200 of the present embodiment shown in FIG. 2 is explained.

Similarly to Embodiment 1 of the present invention, in operation of the variable length decoder of the present embodiment, the first storage unit 10 altogether stores the encoded data and the header shown in FIG. 6. It is assumed that the second storage unit 30 is composed of a two-dimensional array (4×4 elements) for simplicity. The flag register 60 can set the flag in an address (0) through an address (15) according to an address of the second storage unit 30.

When decoding processing begins at Step S30 of FIG. 4, the variable length decoding unit 20 starts operation thereof.

At Step S31, the decoding unit 20 reads a header value (0xC000) and a value (0xC1B3) from the address (0x0000) and the address (0x0001) of the first storage unit 10, and performs header processing. Then, the control unit 21 outputs a reset signal, which is the control signal for initializing the flag register 60, to the flag register 60.

At Step S32, when the flag register 60 receives the reset signal, the flag register 60 resets each flag of all the addresses of the flag register 60 into the value "0", thereby performing initialization. When initialization is completed, the variable length decoding unit 20 moves to a state of decoding.

At Step S33, the decoding unit 22 reads encoded data from the first storage unit 10. Similarly to Embodiment 1 of the present invention, in the variable length decoder 200 of the present embodiment, the variable length decoding unit 20 reads the encoded data as a bit string from the first storage unit 10, and acquires a header, and code data strings (101), (1110), (0101001) and (01110) following thereafter.

At Step S34, the decoding unit 22 compares the read code string with the variable length decoding table (VLC table) of FIG. 9.

At Step S35, the decoding unit 22 converts the inputted code data string into combined data (LAST, RUN, LEVEL) one by one.

At Step S34 through Step S36, combined data (0, 0, 1), (0, 0, 3), (0, 1, 2), and (1, 0, 1) are acquired by the same processing as that of Embodiment 1 of the present invention.

At Step S37, the address generating unit 23 refers to data (RUN) of the acquired combined data, and determines an address of the second storage unit 30 one by one. The non-zero data is stored in the determined address.

As a result, an address, which stores LEVEL=1, is an address (0); an address, which stores LEVEL=3, is an address (1); an address, which stores LEVEL=2, is an address (3); and an address, which stores LEVEL=1, is an address (4).

At Step S38, the decoding unit 22 considers the sign of the value of each LEVEL, and stores the value of each LEVEL in the second storage unit 30 at the address which the control unit 21 has determined.

FIG. 13 illustrates a state of the second storage unit 30 after data-storing in Embodiment 2 of the present invention. In the second storage unit 30, as shown by the dotted arrow in FIG. 10, the address is determined in a zigzag manner. In FIG. 13, a symbol "x" indicates a meaningless and unspecified value in the address where the quantized data of zero is acquired.

At Step S39, the control unit 21 sets the flag value "1" to the address of the flag register 60. The address of the flag register 60 corresponds to the address, which the control unit 21 has determined, of the second storage unit 30. As a result, the flag register 60 becomes as shown in FIG. 14. In other words, FIG. 14 illustrates a state of the flag register 60 after setting a flag in Embodiment 2 of the present invention.

Thereby, conversion to quantization data finishes and control moves to Step S40.

As shown in FIG. 5, the control moves to Step S40, and the inverse quantizing unit 40 starts operation thereof.

At Step S41, the inverse quantizing unit 40 sets an address, where the quantized data is read, of the second storage unit 30 from the address (0), one by one.

At Step S42, the selector 42 examines the flag of the address of the flag register 60 corresponding to the address, which is set up in Step S41, of the second storage unit 30, and judges whether the flag indicates the value "0" or not. When the judgment result is "No", the processing moves to Step S43, and when the judgment result is "Yes", the processing moves to Step S44.

At Step S43, since the flag indicates the value "1", the selector 42 selects the quantized data (non-zero) stored in the address, which is set up at Step S41, of the second storage unit 30, and transmits the selected quantized data (non-zero) to the inverse quantization processing unit 41. At Step S44, since the flag indicates the value "0", the selector 42 selects the value "0", which the data setting unit 43 has set up, and sends the selected value "0" to the inverse quantization processing unit 41.

At Step S45, it is judged whether acquisition of all coefficient data has completed or not. When the acquisition of all coefficient data is not completed, the processing returns to Step S41, and the next address of the second storage unit is set up. Then Step S42 through Step S45 is repeated. At Step S45, when the acquisition of all coefficient data is completed, the processing moves to Step S46.

At Step S46, the inverse quantization processing unit 41 performs inverse quantization processing using the coefficient data (that is, quantized data) that is transmitted from the selector 42, and generates DCT data.

At Step S47, the inverse DCT unit 50 performs inverse DCT processing using the DCT data, which the inverse quantization processing unit 41 has generated, and outputs the decoded data to the output terminal 90.

At Step S48, decoding processing of one macro block is completed.

As explained above, the variable length decoder 200 of the present embodiment comprises the flag register 60 corresponding to each address of the second storage unit 30. The second storage unit 30 stores only the non-zero quantized data. The variable length decoder 200 sets the value "1" indicating non-zero to the corresponding flag of the flag register 60. According to this method, when the inverse quantizing unit 40 reads the quantized data from the second storage unit 30, the inverse quantizing unit 40 refers to the flag of the flag register 60, and reads only the non-zero quantized data of the second storage unit 30. The other data can be masked to be a value "0" that is set in the data setting unit 43.

Although it is necessary to set the number, which corresponds to the number of addresses of the second storage unit 30, of the flag registers 60 to be provided, it is unnecessary to perform initialization of the second storage unit 30 for decoding processing of every macro block. Therefore, an ordinary memory can be used for the second storage unit 30. Although initialization of the flag register 60 has to be performed for decoding processing of every macro block, the processing amount is very small. As a result, according to the variable length decoder 200 of the present embodiment, shortening the decoding processing time of variable length encoding data can be realized.

In explanation of the variable length decoder 200 of the present embodiment, for simplicity of explanation, as shown in FIG. 13, it is assumed that the second storage unit 30 is a two-dimensional array (4×4 elements). However, the second storage unit 30 may be the one-dimensional array as shown in FIG. 12. In this case, what is necessary is that addresses of the one-dimensional array storage unit of FIG. 12 are arranged in the order of the zigzag scan of the two-dimensional array of FIG. 13.

It has been assumed that the flag register 60 of FIG. 14 includes the address (0) through the address (15). The size of the flag register 60 needs to correspond to the size of the address of the second storage unit 30. When the one-dimensional array storage unit of FIG. 12 is used as the second storage unit 30, what is necessary is that the flag register 60 has the address (0x0000) through the address (0x017F), and stores 1 bit in each address.

According to the present invention, decoding of the variable length encoding data can be realized efficiently at a high level by few hardware resources, and the variable length decoder consumes power lower than that of the prior art.

Having described preferred embodiments of the invention with reference to the accompanying drawings, it is to be understood that the invention is not limited to those precise embodiments, and that various changes and modifications may be effected therein by one skilled in the art without departing from the scope or spirit of the

What is claimed is:

1. A variable length decoding device for decoding variable length encoded data, said variable length decoding device comprising:
   a storage unit; and
   a variable length decoding unit operable to
      transform variable length encoded data into intermediate data which includes a value able to indicate an end of non-zero quantized data,
      generate partial quantized data from the intermediate data until the end of non-zero quantized data indicated by said value, and
      store only the partial quantized data in said storage unit.

2. The variable length decoding device as defined in claim 1,
   wherein said storage unit comprises an initializing mechanism operable to initialize all addresses in said storage unit to zero; and wherein said variable length decoding unit stores only the partial quantized data in said storage unit after said initializing mechanism has initialized all addresses in said storage unit to zero.

3. The variable length decoding device as defined in claim 2, wherein said variable length decoding unit comprises:
a control unit;
a decoding unit; and
an address generating unit;
wherein said control unit is operable to issue a control signal to said initializing mechanism;
wherein said initializing mechanism is operable to initialize all addresses of said storage unit to zero based on the control signal;
wherein said address generating unit is operable to generate, based on the intermediate data, an address in said storage unit where the partial quantized data is to be stored; and
wherein said decoding unit is operable to
transform the encoded data into the intermediate data,
generate the partial quantized data, and
store only the partial quantized data at the address in said storage unit generated by said address generating unit.

4. The variable length decoding device as defined in claim 2, further comprising:
an inverse quantizing unit operable to generate discrete cosine transform (DCT) data based on quantized data read from said storage unit; and
an inverse discrete cosine transforming unit operable to generate decoded data based on the DCT data.

5. The variable length decoding device as defined in claim 1, further comprising a flag register operable to store, for each address in said storage unit, a flag indicating either zero quantized data or non-zero quantized data;
wherein said variable length decoding unit is further operable to
set a flag indicating zero quantized data at each address in said flag register, thereby initializing said flag register; and
set a flag indicating non-zero quantized data at an address in said flag register corresponding to non-zero quantized data.

6. The variable length decoding device as defined in claim 5, wherein said variable length decoding unit comprises:
a control unit;
a decoding unit; and
an address generating unit;
wherein said control unit is operable to issue a control signal to said flag register;
wherein said flag register is operable to set, according to the control signal, a flag indicating zero quantized data in each address in said flag register;
wherein said address generating unit is operable to generate, based on the intermediate data, an address in said storage unit where the partial quantized data is to be stored; and wherein said decoding unit is operable to
transform the variable length encoded data into the intermediate data,
generate the partial quantized data based on the intermediate data,
store the partial quantized data in said storage unit at the address generated by said address generating unit, and
set a flag indicating non-zero quantized data at a corresponding address in said flag register.

7. The variable length decoding device as defined in claim 5, further comprising an inverse quantizing unit operable to inverse quantize the partial quantized data from an address in said storage unit when a corresponding flag of said flag register indicates non-zero quantized data, thereby generating non-zero DCT coefficients;
wherein when a corresponding flag of said flag register indicates zero quantized data, said inverse quantizing unit generates a value of zero.

8. The variable length decoding device as defined in claim 7, further comprising an inverse discrete cosine transforming unit operable to generate decoded data based on the DCT coefficients generated by said inverse quantizing unit.

9. A variable length decoding method for decoding variable length encoded data, said variable length decoding method comprising:
transforming the variable length encoded data into intermediate data including a value able to indicate an end of non-zero quantized data;
generating partial quantized data from the intermediate data until the end of non-zero quantized data indicated by said value; and
storing only the partial quantized data in a storage unit.

10. The variable length decoding method as defined in claim 9, further comprising initializing all addresses in said storage unit to zero, wherein said storing is performed after said initializing.

11. The variable length decoding method as defined in claim 9, further comprising:
initializing a flag register by setting a flag indicating zero quantized data at all addresses in a flag register; and
setting a flag indicating partial quantized data in the flag register at an address corresponding to a storage address in said storage unit for the partial quantized data;
wherein said storing is performed after said initializing of the flag register.

12. The variable length decoding method as defined in claim 11, further comprising:
inverse quantizing the partial quantized data from an address in said storage unit when a corresponding flag in said flag register indicates non-zero quantized data, thereby generating non-zero DCT coefficients; and
generating a value of zero when a corresponding flag in said flag register indicates zero quantized data.

* * * * *